United States Patent [19]
Katsu et al.

[11] Patent Number: 4,953,132
[45] Date of Patent: Aug. 28, 1990

[54] MEMORY CIRCUIT FOR AND METHOD OF PROTECTING MEMORY DATA INTEGRITY DURING AN OUTPUT OPERATION UTILIZING MEMORY DATA

[75] Inventors: Toshiyuki Katsu; Fusako Inotsume, both of Tokyo, Japan

[73] Assignee: Pioneer Electronic Corporation, Tokyo, Japan

[21] Appl. No.: 236,410

[22] Filed: Aug. 25, 1988

[30] Foreign Application Priority Data

Feb. 4, 1988 [JP] Japan .................................. 63-22852

[51] Int. Cl.$^5$ .............................................. G11C 8/00
[52] U.S. Cl. .................................. 365/228; 365/189.05
[58] Field of Search .................. 365/226, 228, 189.05, 365/201, 230.08

[56] References Cited

U.S. PATENT DOCUMENTS 4,623,887 11/1986 Welles, II .............................. 364/200
4,631,668 12/1986 Kubo et al. ........................... 364/200
4,713,765 12/1987 Mackiewicz et al. ............... 365/228

Primary Examiner—James W. Moffitt
Attorney, Agent, or Firm—Sughrue, Mion, Zinn, Macpeak & Seas

[57] ABSTRACT

An output memory circuit device for and method of providing protection to an integrity of data stored in an external memory circuits during an output operation utilizing the data. Control means selectively controls activation of an external memory to an active state and an inactive back-up state, and obtains data from the external memory circuit during times corresponding to the active state. Storage circuit receives and temporarily stores data supplied by the control circuit and processing circuit receives and processes data fed from the storage circuit and outputs processed data to an output circuit. The control circuit selectively controls an activation of the external memory circuit to the inactive back-up state during times when receiving and processing is conducted to receive and process data fed from the storage circuit and output processed data to the output circuit.

10 Claims, 2 Drawing Sheets

MEMORY CIRCUIT FOR AND METHOD OF PROTECTING MEMORY DATA INTEGRITY DURING AN OUTPUT OPERATION UTILIZING MEMORY DATA

FIELD OF THE INVENTION

The invention relates to an output device having an external memory such as a static RAM and the like, and more particularly. relates to an improvement in a memory circuit for controlling a RAM in order to protect memory data integrity during an outputting operation of an output device.

BACKGROUND OF THE INVENTION

An example of a disadvantaged memory circuit having an output device and external memory is shown in FIG. 1.

In FIG. 1 there are illustrated in block diagram form a static RAM 1 operating as an external memory, (hereinafter "SRAM"): an external memory controlling unit 2. (hereinafter an "SRAM controlling unit") for controlling SRAM 1 through a controlling line 2a and obtaining data stored in the SRAM through a data line 2b when the SRAM 1 is operated in an active state of operation, an output data controlling unit 3 for outputting data obtained by the SRAM controlling unit 2: and an output unit 4 controlled by an output signal from the output data controlling unit 3.

Next, an operation of the output device thus constructed will be described.

The SRAM controlling unit 2 operates to put the SRAM 1 into an active state through a control line 2a obtains data from the SRAM along a line 2b and transfers the data to the output data controlling unit 3 through a data line 6. The output data controlling unit 3 processes the data fed from the SRAM controlling unit 2 and then outputs the processed data to the output unit 4 along a line 7.

With the above-described disadvantaged memory circuit, a potential for a problem exists in that, in the case where the output unit 4 needs a large amount of current as shown in the upper plot of FIG. 2, a power source voltage may substantially drop as shown in the lower plot of FIG. 2 and become smaller than a minimum operation voltage of the SRAM during an output operation of the output unit 4. As a result of the voltage drop a reliable operation of SRAM cannot be guaranteed and thus there is a potential for an occurrence of an unreliable condition in data obtained from the SRAM 1 through the data line 2b. This in turn causes a delivery of unreliable data to the output unit 4.

SUMMARY OF THE INVENTION

Accordingly an object of the present invention is to provide a unique and novel memory circuit arrangement which avoids the above-mentioned problems.

Another object thereof is thus to provide a memory circuit arrangement which is capable of rendering an external memory (e.g., a static RAM) inactive (i.e., to a "back-up" state) when an output unit needs a large amount of current so as to protect data stored in the RAM.

The foregoing and other objects are met by the provision of an output memory circuit device comprising: external memory means: control means for selectively controlling activation of said external memory means to an active state and an inactive back-up state, and for obtaining data from said external memory means during times corresponding to said active state: storage means for receiving and temporarily storing data supplied by said control means and processing means for receiving and processing data fed from said storage means, and for outputting processed data to an output means: wherein said control means selectively controls an activation of said external memory means to said inactive back-up state during at least a portion of times during which an output current requirement of said output means exceeds a predetermined amount of current.

The foregoing and other objects are further met by the provision of a method for providing protection to an integrity of data stored in an external memory means during an output operation utilizing said data, said method comprising the steps of: selectively controlling activation of said external memory means to an active state and an inactive back-up state and obtaining data from said external memory means during times corresponding to said active state; receiving and temporarily storing data supplied by said control means into a storage means: and receiving and processing data fed from said storage means, and outputting processed data to an output means: wherein said selectively controlling step controls an activation of said external memory means to said inactive back-up state during at least a portion of times during which an output current requirement of said output means exceeds a predetermined amount of current.

DESCRIPTION OF THE PREFERRED EMBODIMENT

Figure 1:
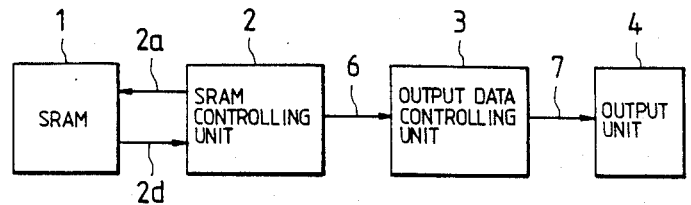
FIG. 1 is a block diagram illustrating an example of a disadvantaged output device.

An embodiment of the present invention will be described hereunder with reference to FIG. 3. Components having the same features/operations as components in FIG. 1 will be designated by like reference numerals.

Figure 3:
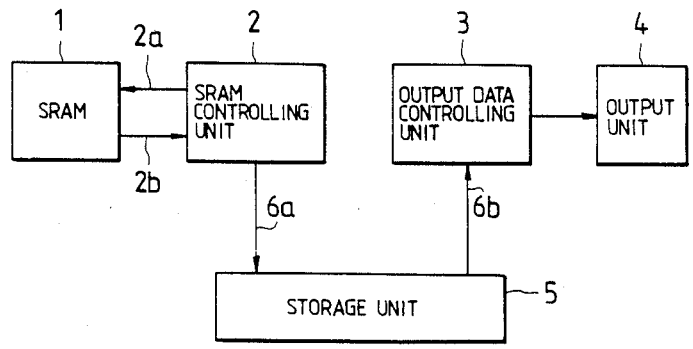
FIG. 3 is a block diagram illustrating a preferred embodiment according to the present invention.

An important difference of the preferred embodiment of FIG. 3 shown in FIG. 1 is to provide a storage unit 5 between the SRAM controlling unit 2 and the output data controlling unit 3. An example of the output unit D1 is an infrared ray driving device for a remote controller or a bell-alarm producing device.

Figure 2:
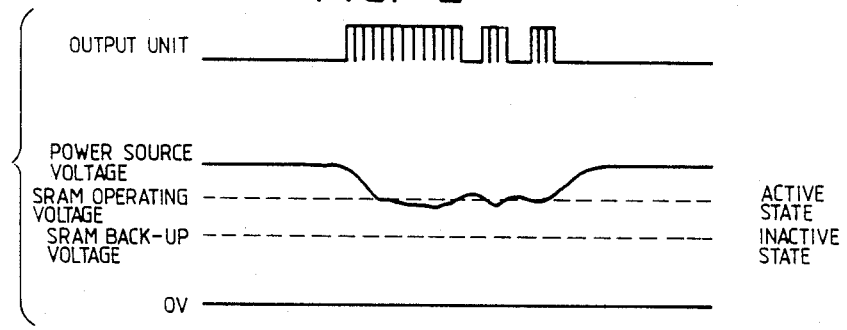
FIG. 2 includes waveform diagrams for description of the devices shown in FIG. 1 and 3.

During operation, the SRAM controlling unit 2 renders the SRAM 1 active FIG. 2(c) through the controlling line 2a, and operates to obtain data from the SRAM along the data line 2b and to temporarily store the data fed from the SRAM 1 in the storage unit 5 using a data line 6a.

Once the data has been temporarily stored in the storage unit 5, an important aspect of the invention is that the SRAM controlling unit 2 renders the SRAM 1 inactive during times when an output current requirement of the output means causes a power level of a power source empowering the memory circuit to fall below a minimum power level required for a reliable data retrieval operation with the external memory means.

A less preferred embodiment is envisioned where there is a selective controlling of an activation of the external memory to an inactive back-up state during at least a portion of times during which an output current requirement of the output means exceeds a predetermined amount of current. (Note: The claimed "predetermined amount of current" would correspond to an output current requirement of the output means which causes a power level of a power source empowering the memory circuit to fall below a minimum power level-required for a reliable data retrieval operation with the external memory means: the predetermined level would depend upon and be determined according to minimum data retrieval operating parameters for an external memory utilized in each particular implementation).

In a preferred embodiment, there is selective controlling of an activation of the external memory means to the inactive back-up state during times when receiving and processing is conducted to receive and process data fed from the storage means, and output processed data to the output means.

The SRAM controlling unit 2 renders the SRAM 1 inactive through use of the controlling line 2a (i.e.. the SRAM controlling unit 2 outputs an appropriate signal along the controlling line 2a so as to force the operating state of the SRAM into an off (i.e.. a "back-up") state). As a result, voltage applied to the SRAM 1 is set for a back-up voltage shown in FIG. 2(d) in order to protect an integrity of memory data stored in the SRAM.

Once the SRAM has been forced into an inactive back-up state, data, which was temporarily stored in the storage unit 5, is transferred to the output data controlling unit 3 successively. The output data controlling unit 3 processes the data and controls the output unit 4 according to the processed data. Accordingly, assuming that a large current is required in the output unit 4 resulting in undesired drop in the power source voltage, there exists no potential that this drop will induce an unreliable operation as the SRAM 1 has previously been put in an inactive back-up state and therefore the data stored in the SRAM 1 is prevented from being mapped. Further, an operation of the output unit 4 is accurately controlled since the data for controlling the output unit 4 is reliably obtained by processing data fed from the storage unit 5 to the output data controlling unit 3.

While the embodiment of the present invention has been described in which the static RAM is employed as the external memory, it will be appreciated by those skilled in the art that the invention may be applied in circuit arrangements using other types of memories (e.g., dynamic RAMS), and thus the invention is not limited thereto.

As described above, data stored in the external memory is transferred to a storage unit separately provided and then, once an operating state of the external memory is forced to an inactive back-up state, the temporarily stored data from the storage unit is used to control the output unit. Consequently. it is possible to prevent an occurrence of error in the data for controlling the output unit to thereby control the output unit accurately. Further, when the output unit requires a large amount of current to produce an output signal, the external memory is protected as it has previously been set inactive. Therefore, the present invention has effects such that the data of the external memory is protected from a substantial dropping of the power source voltage.

Figure 4:
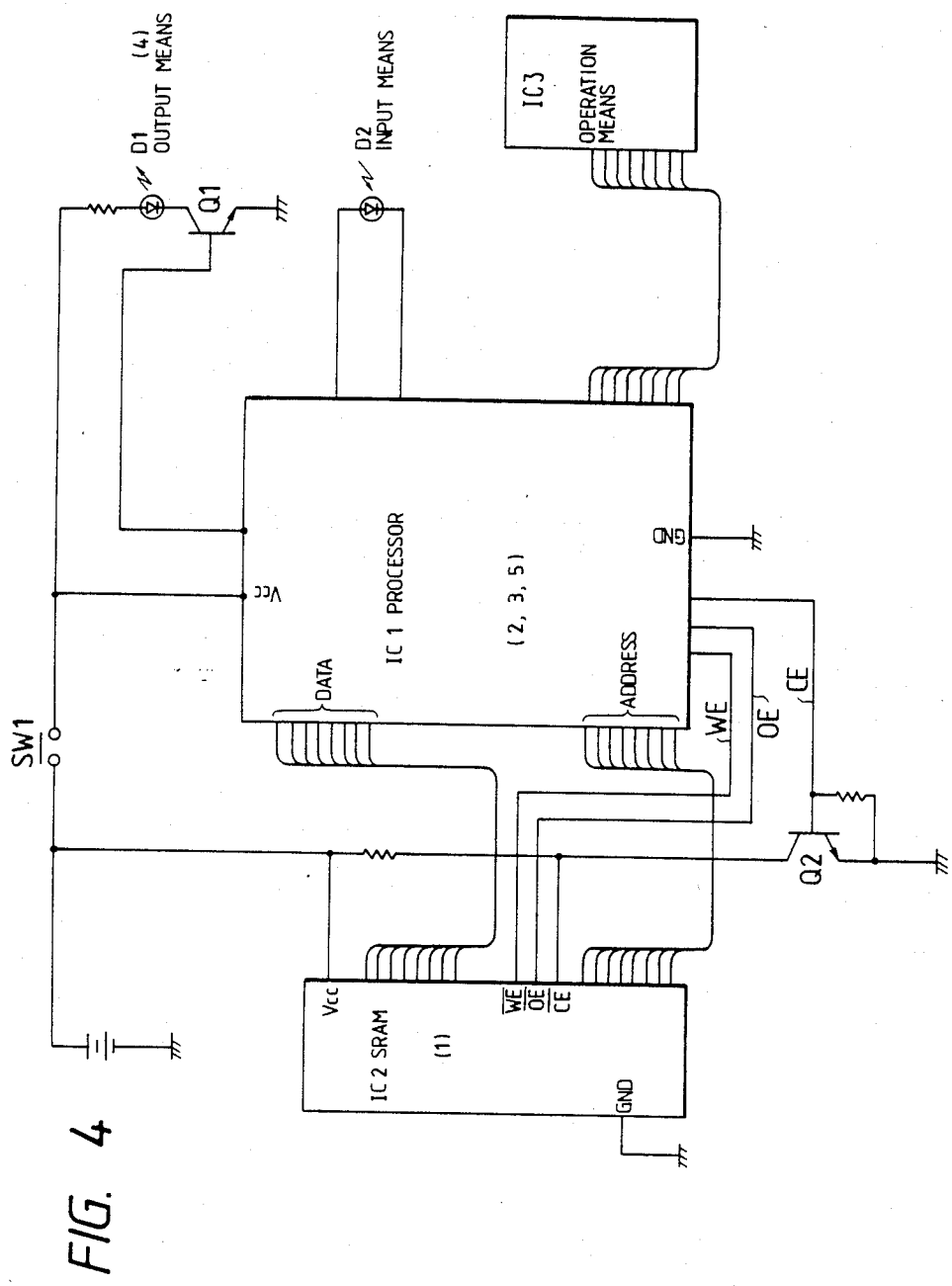
FIG. 4 is a circuit diagram showing the memory remote controller circuit of FIG. 3 in greater detail.

FIG. 4 is a circuit diagram showing the memory remote controller circuit of FIG. 3 in greater detail.

In FIG. 4 circuit components which are the same as those in FIG. 3 are assigned identical reference characters.

With greater particularity toward FIG. 4, an IC 1 includes the SRAM controlling unit 2, the storage unit 5 and the output data controlling unit 3. The IC 1 operates according to a predetermined operation program as discussed with respect to FIG. 3 i.e., operation means is effected utilizing the IC1 processor in conjunction with any well known key pad and ROM device containing programming instructions for an operation of the IC1 processor. An IC 2 corresponds to the SRAM 1. Reference character D1 denotes an LED device as the output unit 4 and input means D2 is an infrared receiving device. The line from the processor IC1 to the base of the transistor Q1 represents output line 7. A signal line CE including a transistor Q2 corresponds to the control line 2a. Data and address buses correspond to the data line 2b. SW1 designates a power switch of the remote controller. An operation means having plural operational keys or the like is provided to transmit commands according to a predetermined key operation to an I/O terminal of the IC 1.

We claim:

1. An output memory circuit device for providing protection to an integrity of data stored in an external memory means during an output operation utilizing said data, comprising:
    external memory means;
    control means for selectively controlling activation of said external memory means to an active state and an inactive backup state, and for obtaining data from said external memory means during times corresponding to said active state;
    storage means for receiving and temporarily storing data supplied by said control means; and
    processing means for receiving and processing data fed from said storage means, and for outputting processed date to an output means;
    wherein said control means further being for selectively controlling an activation of said external memory means to said inactive back-up state during at least a portion of times during which an output current requirement of said output means exceeds a predetermined amount of current.

2. An output memory circuit device as claimed in claim 1 and further comprising:
    power source means for supplying output power to said external memory means, storage means, processing means and output means:
    wherein said predetermined amount of current corresponds to an output current requirement of said output means which causes a power level of said output power to fall below a minimum power level required for a reliable data retrieval operation with said external memory means.

3. An output memory circuit device as claimed in claim 2, wherein said control means selectively controls an activation of said external memory means to said inactive back-up state during times when said processing means receives and processes data fed from said storage means, and outputs processed data to said output means.

4. An output memory circuit device as claimed in claim 3, wherein said external memory means is a static RAM.

5. An output memory circuit device as claimed in claim 3, wherein said external memory means is a dynamic RAM.

6. A method of providing protection to an integrity of data stored in an external memory means during an output operation utilizing said data said method comprising the steps of:

selectively controlling activation of said external memory means to an active state and an inactive back-up state, and obtaining data from said external memory means during times corresponding to said active state receiving and temporarily storing data supplied by said control means into a storage means; and receiving and processing data fed from said storage means, and outputting processed data to an output means;

wherein said selectively controlling step controls an activation of said external memory means to said inactive back-up state during at least a portion of times during which an output current requirement of said output means exceeds a predetermined amount of current.

7. An output memory circuit device as claimed in claim 6 and further comprising the step of:

supplying output power to said external memory means, storage means, processing means and output means;

wherein said predetermined amount of current corresponds to an output current requirement of said output means which causes a power level of said output power to fall below a minimum power level required for a reliable data retrieval operation with said external memory means.

8. An output memory circuit device as claimed in claim 7, wherein said selectively controlling step controls an activation of said external memory means to said inactive back-up state during times when said receiving and processing step is conducted to receive and process data fed from said storage means, and output processed data to said output means.

9. An output memory circuit device as claimed in claim 8, wherein said external memory means is a static RAM.

10. An output memory circuit device as claimed in claim 8, wherein said external memory means is a dynamic RAM.

* * * * *